(12) United States Patent
Stoutjesdijk

(10) Patent No.: US 7,804,434 B2
(45) Date of Patent: Sep. 28, 2010

(54) SWITCHED-CAPACITOR CIRCUIT

(75) Inventor: Remco M. Stoutjesdijk, Edinburgh (GB)

(73) Assignee: Wolfson Microelectronics plc, Edinburgh (GB)

(*) Notice: Subject to any disclaimer, the term of this patent is extended or adjusted under 35 U.S.C. 154(b) by 71 days.

(21) Appl. No.: 12/414,075

(22) Filed: Mar. 30, 2009

(65) Prior Publication Data
US 2009/0243902 A1    Oct. 1, 2009

(30) Foreign Application Priority Data
Mar. 31, 2008    (GB) ................................ 0805828.1

(51) Int. Cl.
*H03M 1/82*    (2006.01)
(52) U.S. Cl. ...................... 341/150; 341/122
(58) Field of Classification Search ................ 341/122, 341/143, 144, 150
See application file for complete search history.

(56) References Cited

U.S. PATENT DOCUMENTS

| | | | |
|---|---|---|---|
| 4,468,653 A * | 8/1984 | Kapral | 341/150 |
| 4,617,481 A | 10/1986 | Masuda | |
| 6,249,240 B1 * | 6/2001 | Bellaouar | 341/172 |
| 6,573,850 B1 * | 6/2003 | Pennock | 341/150 |
| 6,965,333 B1 | 11/2005 | Hsu | |
| 7,102,557 B1 * | 9/2006 | Frith | 341/150 |
| 2009/0066552 A1 * | 3/2009 | Quinn et al. | 341/150 |
| 2009/0231176 A1 * | 9/2009 | Chen et al. | 341/150 |

FOREIGN PATENT DOCUMENTS

| | | | |
|---|---|---|---|
| GB | 2408859 A | | 6/2005 |
| GB | 2425416 A | | 10/2006 |
| GB | 2452521 A | * | 3/2009 |

* cited by examiner

*Primary Examiner*—Howard Williams
(74) *Attorney, Agent, or Firm*—Dickstein Shapiro LLP

(57) ABSTRACT

In a switched-capacitor circuit such as a DAC, charges are accumulated by a plurality of sampling capacitors in dependence upon input digital data during a sampling phase; then, during a sharing phase these charges are shared with a holding capacitor which is connected across an opamp. In the so-called bipolar charging type switched-capacitor DAC, the signal provided by the sampling capacitors is doubled by connecting their opposite sides to positive and negative reference voltages during the sampling phase. However, parasitic capacitances associated with the sampling capacitors then cause a disturbance to the input of the operational amplifier during the sharing phase. By equalising the input sides of the sampling capacitors to a reference voltage, prior to the sharing phase, this disturbance is avoided thereby allowing a low-power opamp to be employed in the DAC. This equalising can be achieved by adding a short equalising clock phase between the usual sampling and sharing clock phases of the DAC.

15 Claims, 18 Drawing Sheets

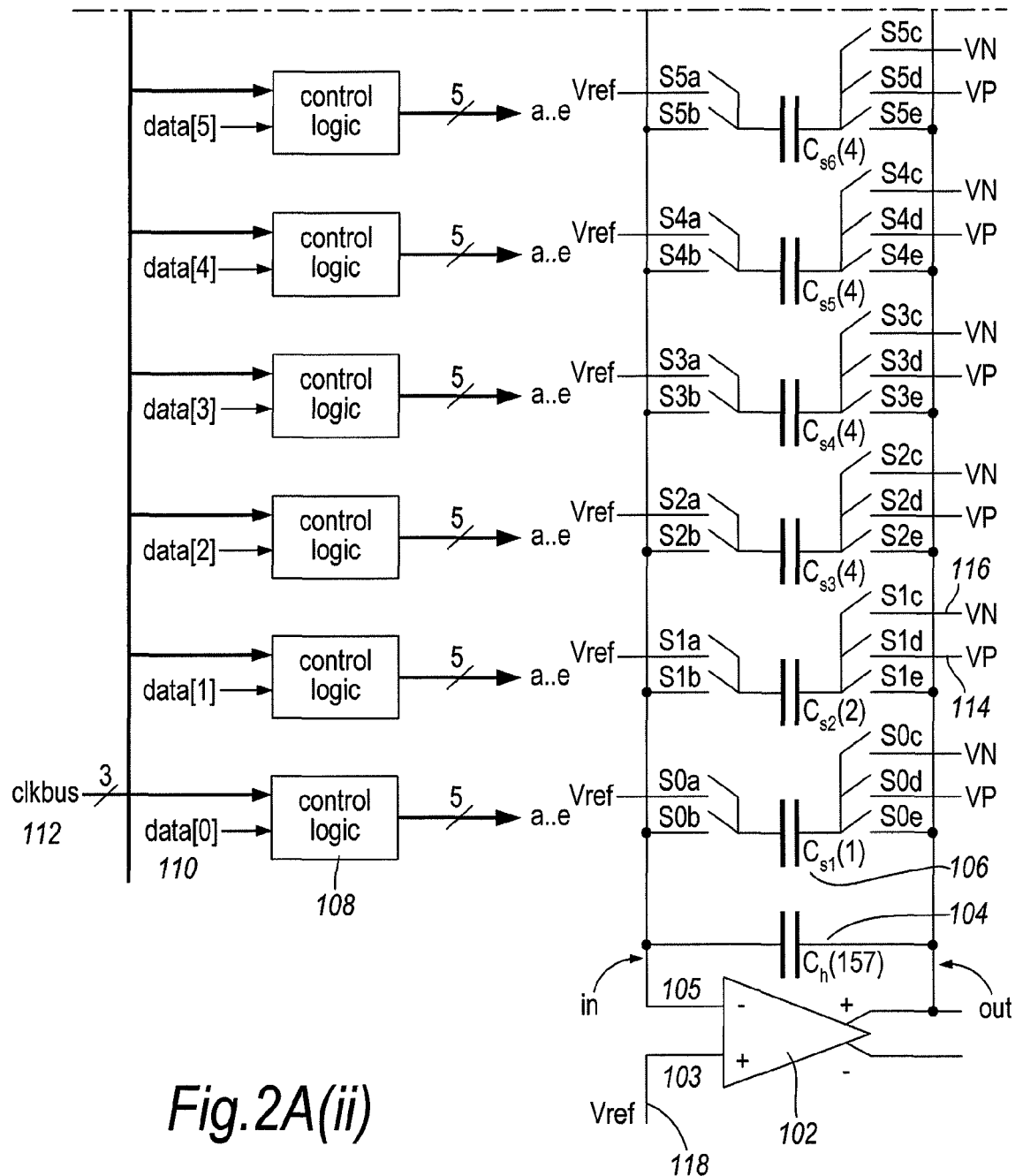
Fig.2A(ii)

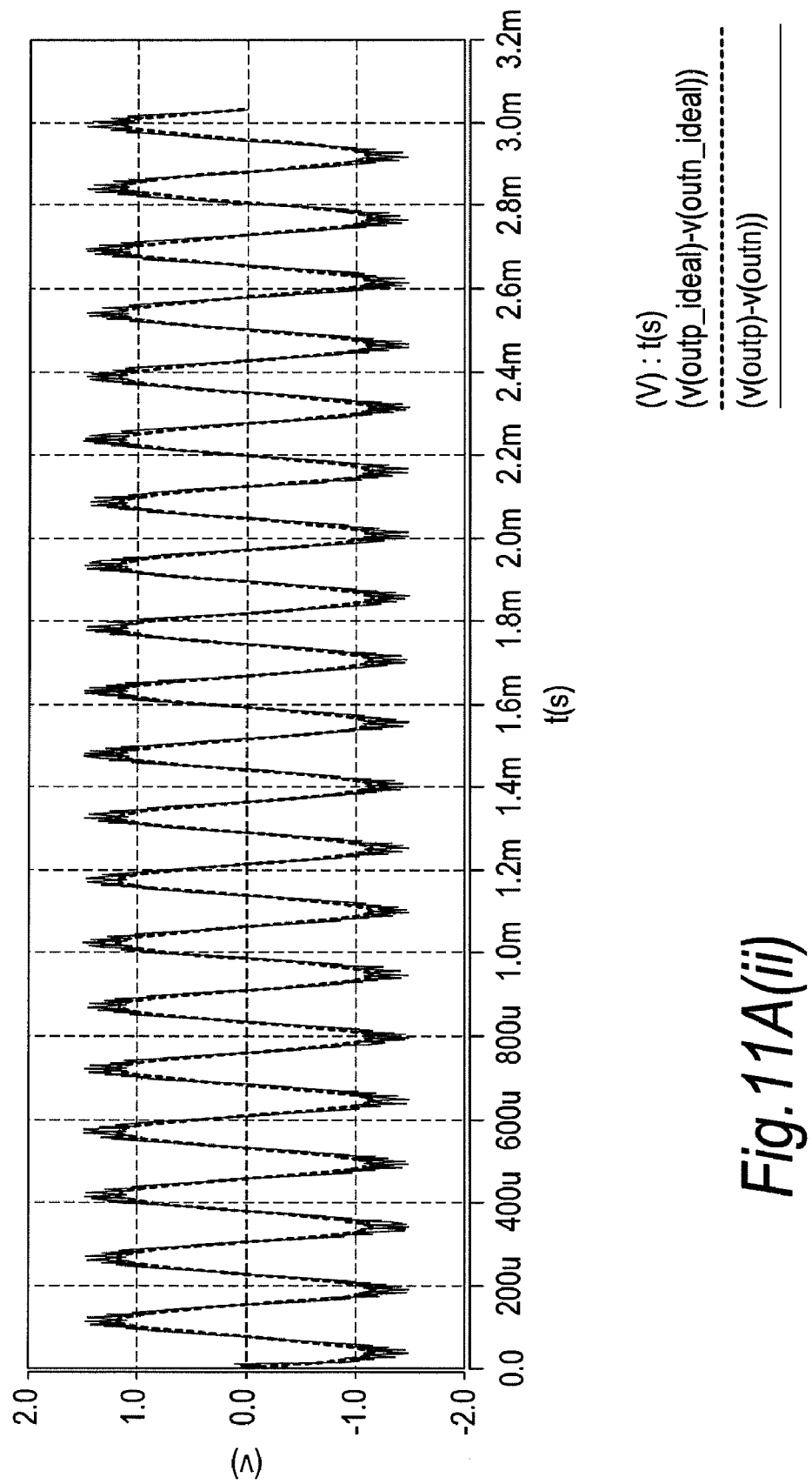
Fig. 11A(ii)

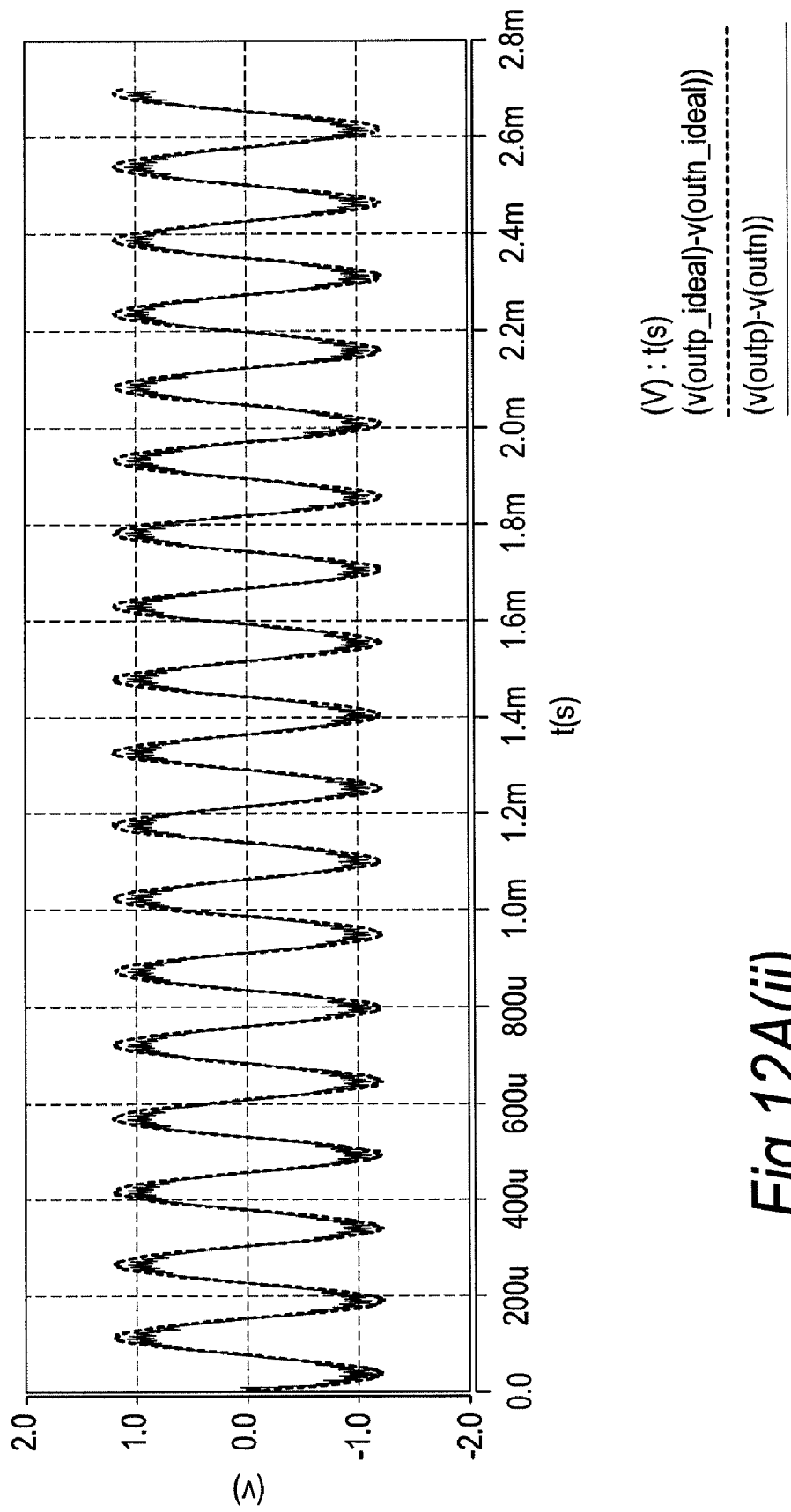
Fig. 12A(ii)

SWITCHED-CAPACITOR CIRCUIT

FIELD OF THE INVENTION

The present invention relates to switched-capacitor circuits, and particularly but not exclusively to switched capacitor digital to analogue converters (DACs), as used for example for processing digital audio signals.

BACKGROUND OF THE INVENTION

The vast majority of audio records are stored in digital format, be it on CDs, computer hard drives, portable music players, etc. because the format allows for perfect storage, simple manipulation and transport. Additionally, most radio and television broadcasts are now in digital format. However the human ear is analogue.

Consequently in every playback situation, whether at home, in a portable or mobile phone situation, this digital signal has to be translated back into the analogue domain. The component that performs this conversion is the Digital-to-Analogue converter (DAC).

In the state of the art, a 16-bits or more pulse code modulation (PCM) word, or a 1-bit Direct Stream Digital (DSD) bit stream, are translated into a noise shaped and truncated digital word with a word length between 3 and 8 bits. These words, at an oversampled clock rate are then sent to a dynamic element weighted thermometer encoding block which drives a binary weighting DAC. FIG. 1 illustrates the signal path as an example.

In the example shown in FIG. 1, 24-bit data from an upsampling filter 70 is converted to data of fewer bits (in this case, 5 bits) at a much higher sample rate, in a sigma-delta modulator 80. The reduced-bit output from the sigma-delta modulator 80 is pseudo-thermometer-encoded (see below) in a dynamic element matching unit 90, prior to being supplied as digital input data to the DAC 100. The DAC 100 is the subject of the invention to be described.

One known type of DAC uses a switched capacitor architecture where the sizes of the capacitors combined with thermometer encoding perform the binary weighting of the input word bits, as illustrated in FIGS. 2A and 2B. Here, FIG. 2A shows the entire circuit structure whilst FIG. 2B is a simplified view focussing on one stage of a capacitor ladder shown in FIG. 2A.

As shown in FIGS. 2A and 2B, the DAC includes an opamp 102 with a non-inverting input 103 coupled to a reference voltage 118, which is typically a potential mid-way between positive and negative power supply voltages (not shown) of a chip or system, and can be considered as a local signal ground. An inverting input 105 is coupled to its output 111 via a relatively large holding capacitor 104 ($C_h$), and due to the properties of the opamp 102 (which tries to bring both inputs to the same potential), the opamp establishes a virtual earth at this inverting input. Connectable in parallel with the holding capacitor 104 is a ladder of sampling capacitors 106 ($C_{s1}$ to $C_{s13}$). Note that there are thirteen of these in the present example, corresponding to the 13-bit data from the dynamic element matching unit 90 of FIG. 1. FIG. 2B shows this more generally as a ladder of N stages SC0, SC1, ... SCN wherein this instance SC denotes not only a sampling capacitor but also its associated switches.

The capacitance values of the individual capacitors 106 (given in brackets in FIG. 2A) are integral multiples of the same basic unit; in the example shown, these multiples form a sequence 1, 2, 4, 4, 4, 4, 1, 2, 4, 4, 4, 4, 1 so as to provide binary weighting, with three different weights, of the input data from dynamic element matching unit 90. Thus, the ladder of capacitors combines pure binary weighting (which would involve a single sequence of capacitance values 1, 2, 4, ... controlled by a binary word), with thermometer code (which converts a binary word into a series of "1"s followed by "0"s, wherein the bit position of the final "1" indicates the binary value) used to control multiple capacitances of equal size) for allowing dynamic element matching. The input data controlling such a capacitor ladder is referred to henceforth as "pseudo-" thermometer code. The holding capacitor is easily large enough (with 157 of these basic units of capacitance) to store all the charges capable of being held on the individual sampling capacitors. Note that in the later FIGS. 4, 6 and 8, "Cs" is used to denote the sum capacitance of the individual sampling capacitors 106.

Individual bits 110 of the 13-bit pseudo-thermometer-encoded data are used, through control logic 108, to control an arrangement of switches for selectively coupling each sampling capacitor 106 to various voltages, at timings determined by clock signals 112 at a frequency $f_s$. As shown most clearly in FIG. 2B, showing a capacitor C0 as an example, each individual $C_s$ has five switches Sna to Sne for connecting one or other side of the capacitor to positive or negative reference potentials 114 and 116, to the holding capacitor 104, or to the opamp inverting input 105.

The various clock phases and timings are depicted in FIG. 3. As is apparent from the Figure, the clock phases form non-overlapping but consecutive portions of a common clock CLK_IN of period $t_s=1/f_s$.

The first phase $\phi_1$ of each clock cycle (operation cycle) is called the discharge or reset phase. In this relatively brief phase, both plates of the sampling capacitors are driven to an equal voltage to remove any residual charge from the sampling capacitor, left from the previous sampling period. In other words each sampling capacitor is brought to a non-signal-dependent state prior to the next sampling phase, which avoids any signal-dependent loading of reference voltage sources used in the sampling phase.

Subsequently, during the charge or sampling phase $\phi_2$, the left hand plate (input side) of each sampling capacitor 106 is connected to a reference equal to the op amp 102 reference voltage 118 (Vref). The right hand plate is connected to one or other of two reference voltage sources in dependence upon the corresponding bit in the thermometer-encoded data supplied to the DAC. That is, the output side of a sampling capacitor is coupled to a high reference (VP, 114) when the data bit for the corresponding data line (110 in FIG. 2) equals '1' and to a negative reference (VN, 116) when the data bit equals '0'. The combination of the weights of the capacitances and the thermometer encoding ensures that the sum of the charges on the individual sampling capacitors $$106 \sum_{i=1}^{N} Qi$$

is analogous to the analogue representation of the PCM input word. In effect, the sum of charges Q can be represented as the sum capacitor $C_s$ charged to the signal voltage $V_{sig}$, as follows:

$$\sum_{i=1}^{N} Q_i = \sum_{i=1}^{N} C_i V_i \qquad \text{Equation 1}$$
$$= C_s \sum_{i=1}^{N} \frac{C_i}{C_s} V_i$$
$$= C_s V_{sig}$$

This operation is illustrated in FIG. 4 which shows a sampling capacitor Cs charged to the signal voltage on its right hand plate during the charge phase $\phi_2$, where Cs here is the sum of all the individual sampling capacitors $C_{s1}$ to $C_{s13}$ shown in FIG. 2.

After this charge phase $\phi_2$, the DAC enters a charge sharing phase $\phi_3$ in which the charge accumulated on the sampling capacitors 106 is shared with a holding capacitor Ch104 connected between the input 105 and output 111 of the operational amplifier 102. The amplifier 102 is connected to reference voltage 118 at its other, non-inverting input terminal 103 and thus maintains a virtual earth potential at the inverting input 105. In order to do this, it forces the output 111 to go to:

$$V_{out} = \frac{V_{out}(z^{-1})C_h + V_{sig}C_s}{C_s + C_h} \qquad \text{Equation 2}$$

$$V_{out}\left(1 - \frac{z^{-1}C_h}{C_s + C_h}\right) = V_{sig}\left(\frac{C_s}{C_s + C_h}\right)$$

$$V_{out} = V_{sig}\left(\frac{\left(\frac{C_s}{C_s + C_h}\right)}{1 - \left(\frac{C_h}{C_s + C_h}\right)z^{-1}}\right)$$

In practice, Ch is a multiple of Cs so that the DAC 100 accumulates the previous output voltage from the preceding clock cycle and the sampled voltage from the latest sampling phase, and in this fashion acts as an integrator that has low-pass filter properties. The operation then begins again in a new clock cycle with fresh input data.

To obtain an accurate output voltage, it is necessary to wait until the amplifier has settled and the time taken for this will depend upon the performance (e.g. slew rate) of the amplifier. In general, amplifier performance is directly relate to power consumption, which can be a limiting factor in portable and battery-powered systems; however, the amplifier performance required in a conventional switched-capacitor DAC is relatively low as explained later.

As an extension to this architecture, there has recently been proposed a so-called bipolar charging, also called bipolar sampling or "flipping", type switched-capacitor DAC, which doubles the output signal, and hence the signal-to-noise ratio, for a given size of sampling capacitor. This type of switched-capacitor DAC is the subject of U.S. Pat. No. 7,102,557, the entire contents of which are hereby incorporated by reference. FIG. 5 shows how the circuit structure is modified from that in FIG. 2. The operation cycle of such a bipolar-charging type DAC is illustrated in FIG. 6.

During the discharge or reset phase $\phi_1$, the charge on the sampling capacitors 106 is reset so that the sampling process is independent of the previous state. This phase is the same as shown in FIG. 4 for the conventional switched-capacitor DAC.

By contrast with FIG. 4, however, during the charge or sampling phase $\phi_2$, both sides of the sampling capacitors 106 are connected to either one of the reference potentials 114 and 116 (see FIG. 5). That is, the right hand (output) sides of the sampling capacitors are charged to the positive reference VP when the corresponding bit in the input data equals '1' and to negative reference VN when the corresponding bit of the input data equals '0'. Conversely, the left hand (input) sides of the sampling capacitors 106 are charged to the negative reference VN when the input data equals '1' and to positive reference VP when the input data equals '0'. In this fashion the voltage across each individual sampling capacitor 106 is doubled and therefore so is the total charge:

$$\sum_{i=1}^{N} Q_i = \sum_{i=1}^{N} C_i 2V_i \qquad \text{Equation 3}$$
$$= 2C_s \sum_{i=1}^{N} \frac{C_i V_i}{C_s}$$
$$= 2C_s V_{sig}$$

As explained previously, the sampling capacitor indicated by Cs in FIGS. 4 and 6 represents the sum of all the individual sampling capacitors 106 shown in FIGS. 2A and 5. In the bipolar charging scheme, the output side of the equivalent sampling capacitor Cs is charged to the signal voltage whilst its input side is charged to the inverted signal voltage because of the inverse data polarity during charging. In effect the (differential) voltage across the sampling capacitor Cs is thus doubled. This leads to double the voltage swing at the output 111 of the op amp 102 without increase in the capacitor size, leading to an improved Signal-to-Noise Ratio (SNR) for a given capacitor size.

When designing an integrated circuit, a problem associated with implementing a DAC using this architecture are the various parasitic capacitances in the circuit, notably the parasitic capacitances from the op amp input (left hand) side capacitor plates and their associated switches (typically MOS transistors) to the IC substrate. These are denoted 107 and 109 in FIG. 6.

Focusing on the left hand side (input side) of the sampling capacitors Cs, the sum of the charges on the left hand capacitor plates equals the sum of the charges applied to the sum of the parasitic capacitances and is directly dependent on the inverted signal (because of the bipolar charging).

After the charge phase $\phi_2$ has completed, the share phase ($\phi_3$) is initiated. The input sides of all the sampling capacitors 106 are connected together and to the inverting input 105 of the operational amplifier 102, in the same way as for the conventional (non-bipolar charging) DAC. In a conventional, non-bipolar charging switched-capacitor DAC, each sampling capacitor is only charged to a data dependent reference (VP or VN) on the output side of the operational amplifier 102, and the input side is always charged to the same reference voltage (Vref, 118) that appears on the amplifier input terminals. When connecting the charged sampling capacitors 106 across the hold capacitor 104 and inverting operational amplifier 102, this results in a quick charge redistribution (passive settling) and the requirements on the operational amplifier performance are relatively low.

However, bipolar charging places much greater demands on the performance of the operational amplifier. In the bipolar capacitor charging architecture, as soon as the sharing phase $\phi_3$ is enabled, the inverting operational amplifier input terminal 105 connects to the inverted signal voltage as indicated in FIG. 6, while its non-inverting input 103 is connected to Vref and thus an unequal voltage appears at its input terminals 103, 105. The operational amplifier now has to respond to a large disturbance (i.e. a large transient voltage) and has to change its output 111 so as to re-equalise both inputs to the reference voltage 118. Because of the parasitic capacitance $Cp_1$ this cannot occur instantly as the capacitor needs current from the output 111 of the operational amplifier 102 to charge up. This current is indicated by the arrows in the share phase depicted in FIG. 6. This introduces a performance dependency on the amplifier bandwidth, slew rate and settling behaviour.

A secondary effect of the input parasitic capacitance is found in the introduction of a gain error. There are parasitic capacitances 107, 109 on both sides of the sampling capacitor as already mentioned. The parasitic capacitance 109 at the output (right hand) side of each sampling capacitor 106 is connected in parallel to the amplifier output 111. Its voltage therefore follows the output voltage directly and is therefore insignificant. However cancellation of the input side parasitic capacitance charge does affect the output. Because the input 105 experiences an out of phase signal, the output 111 rises in-phase to compensate. This results in a positive gain error.

Accordingly, it would be desirable to provide a switched-capacitor circuit having the advantages of bipolar charging but without the concomitant drawbacks due to parasitic capacitance.

It would be further desirable to provide a bipolar-charging, switched capacitor circuit which uses an inexpensive and low power operational amplifier.

SUMMARY OF THE INVENTION

According to a first aspect of the present invention, there is provided a switched-capacitor circuit comprising:
an operational amplifier having a first input, a second input, and an output;
a holding capacitor having a first side and a second side respectively coupled between the first input and the output of the operational amplifier;
one or more sampling capacitors each having a first side and a second side and each provided with respective switches to selectively couple the one or more sampling capacitors to any of first and second voltage sources, a reference voltage, and the holding capacitor; and
switching logic configured to control said switches in a repetitive operation cycle, said operation cycle including:
  a charging phase in which the switching logic selects at least one of the sampling capacitors to be connected at either side thereof to the first and second voltage sources respectively;
  an equalization phase in which the switching logic connects the first side of the one or more sampling capacitors to the reference voltage to change the voltage on both sides of the sampling capacitors if the first side has a voltage other than the reference voltage; and
  a sharing phase in which the switching logic connects the one or more sampling capacitors across the holding capacitor for transferring charge from the sampling capacitors to the holding capacitor.

According to a second aspect of the present invention, there is provided a sample-and-hold circuit comprising:
an operational amplifier having a first input, a second input, and an output;
a holding capacitor having a first side and a second side respectively coupled between the first input and the output of the operational amplifier;
at least one sampling capacitor having a first side and a second side and provided with respective switches to selectively couple the sampling capacitor to any of first and second voltage sources, a reference voltage, and the holding capacitor; and
switching logic arranged to control said switches in a repetitive operation cycle, said operation cycle including:
  a charging phase in which the switching logic allows the sampling capacitor to be connected at either side thereof to the first and second voltage sources respectively; and
  a sharing phase in which the switching logic connects the sampling capacitor across the holding capacitor for transferring charge from each sampling capacitor to the holding capacitor.

According to a third aspect of the present invention, there is provided a method of controlling a switched-capacitor circuit comprising an operational amplifier having a first input, a second input, and at least one output, a holding capacitor having an first side and an second side respectively coupled between the first input and the output of the operational amplifier, and one or more sampling capacitors each having a first side and a second side and provided with respective switches to selectively couple the one or more sampling capacitors to any of first and second voltage sources, a reference voltage, and the holding capacitor; the method comprising controlling said switches in a repetitive operation cycle, said operation cycle including:
  a bipolar charging phase of connecting at least one of the sampling capacitors on both sides to the first and second voltage sources;
  an equalization phase of connecting the first side of the sampling capacitors to the reference voltage to raise the voltage on both sides of the sampling capacitors; and
  a sharing phase of connecting the sampling capacitors across the holding capacitor for transferring charge from the sampling capacitors to the holding capacitor.

According to a fourth aspect of the present invention, there is provided a method of operating a sample-and-hold circuit, the circuit comprising an operational amplifier having a first input, a second input, and an output; a holding capacitor having a first side and a second side respectively coupled between the first input and the output of the operational amplifier; at least one sampling capacitor having a first side and a second side and provided with respective switches to selectively couple the sampling capacitor to any of first and second voltage sources, a reference voltage, and the holding capacitor;
the method comprising controlling said switches in a repetitive operation cycle, said operation cycle including:
  a charging phase in which the switching logic allows the sampling capacitor to be connected at either side thereof to the first and second voltage sources respectively; and
  a sharing phase in which the switching logic connects the sampling capacitor across the holding capacitor for transferring charge from each sampling capacitor to the holding capacitor.

An embodiment of the present invention can provide a switched-capacitor DAC of the bipolar charging type in which the transient large scale input voltage on the operational amplifier is prevented, thus reducing the requirements on the performance of the amplifier.

Thus, the present invention can be advantageously applied to switched-capacitor DACs. However, the bipolar charging, switched-capacitor architecture already referred to can be applied to other types of circuit apart from DACs, namely filter and mixer circuits. Depending upon the application for which the circuit is intended, and also its implementation in terms of integrated circuit design, the above-mentioned problems of transient voltage and gain error may be an issue for such other types of circuit as well.

Other embodiments of the present invention, therefore, provide a switched capacitor filter and/or a switched-capacitor mixer employing the bipolar charging scheme already referred to above and which preferably, but not necessarily, avoid or mitigate the above-mentioned problems due to parasitic capacitance.

BRIEF DESCRIPTION OF THE DRAWINGS

Reference is made, by way of example only, to the accompanying drawings in which.

DETAILED DESCRIPTION

An embodiment of the present invention will now be explained by referring to FIGS. 7 to 12, taking a digital-to-analogue converter as an example.

Figure 5A:
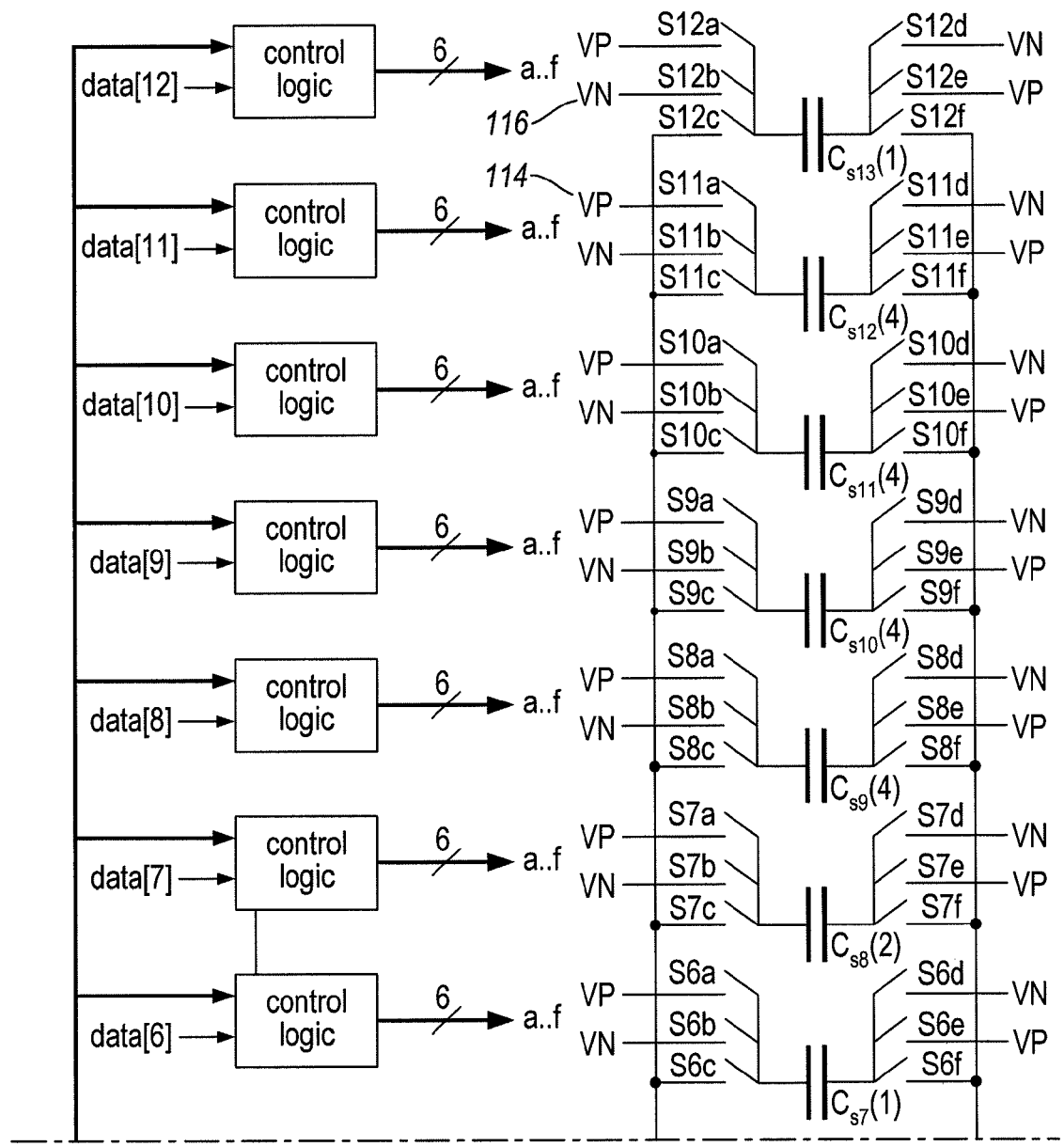
FIG. 5 is a schematic circuit diagram of a bipolar charging, switched-capacitor D/A converter, to which the present invention may be applied.
Figure 5B:
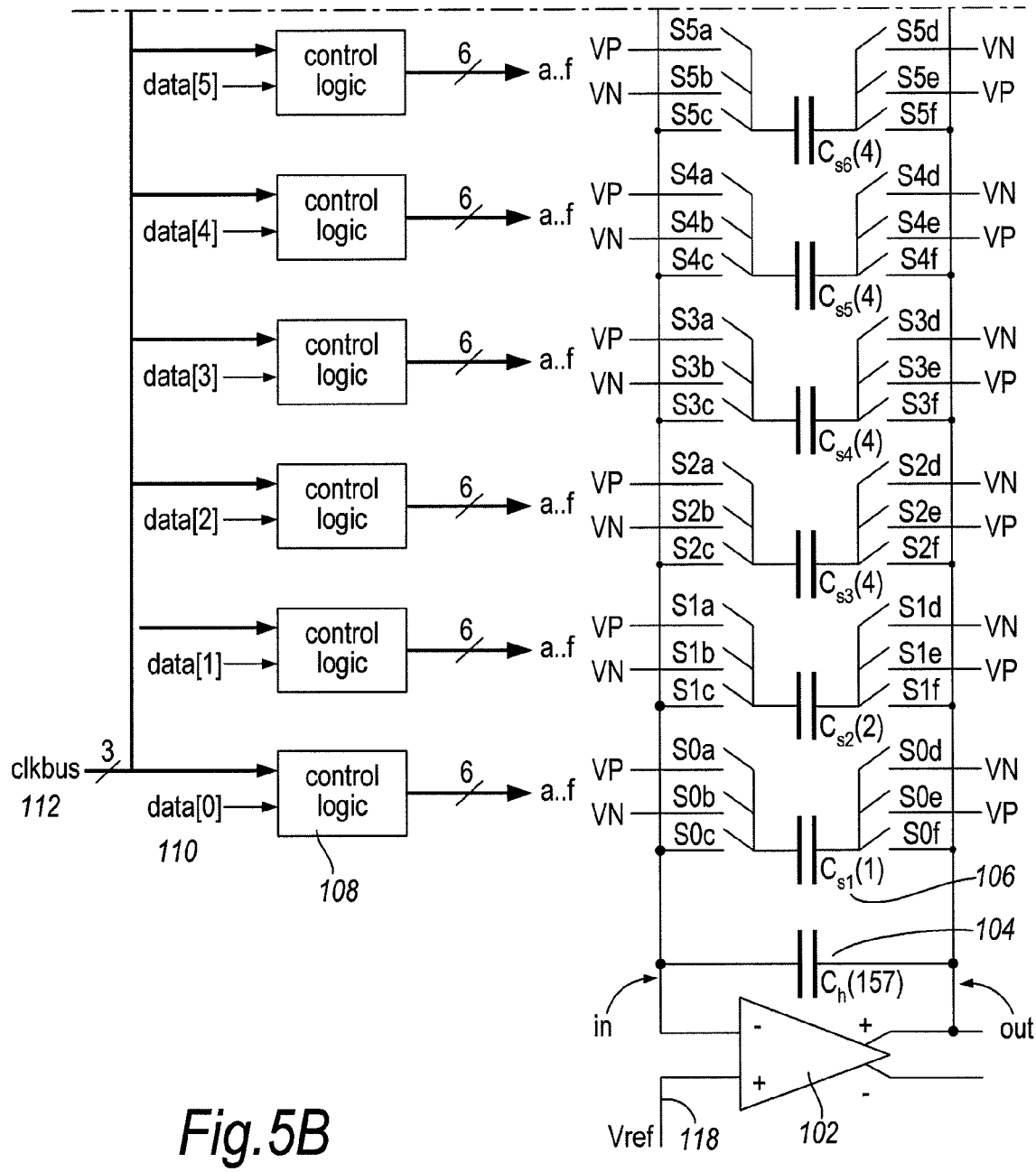
Figure 6:
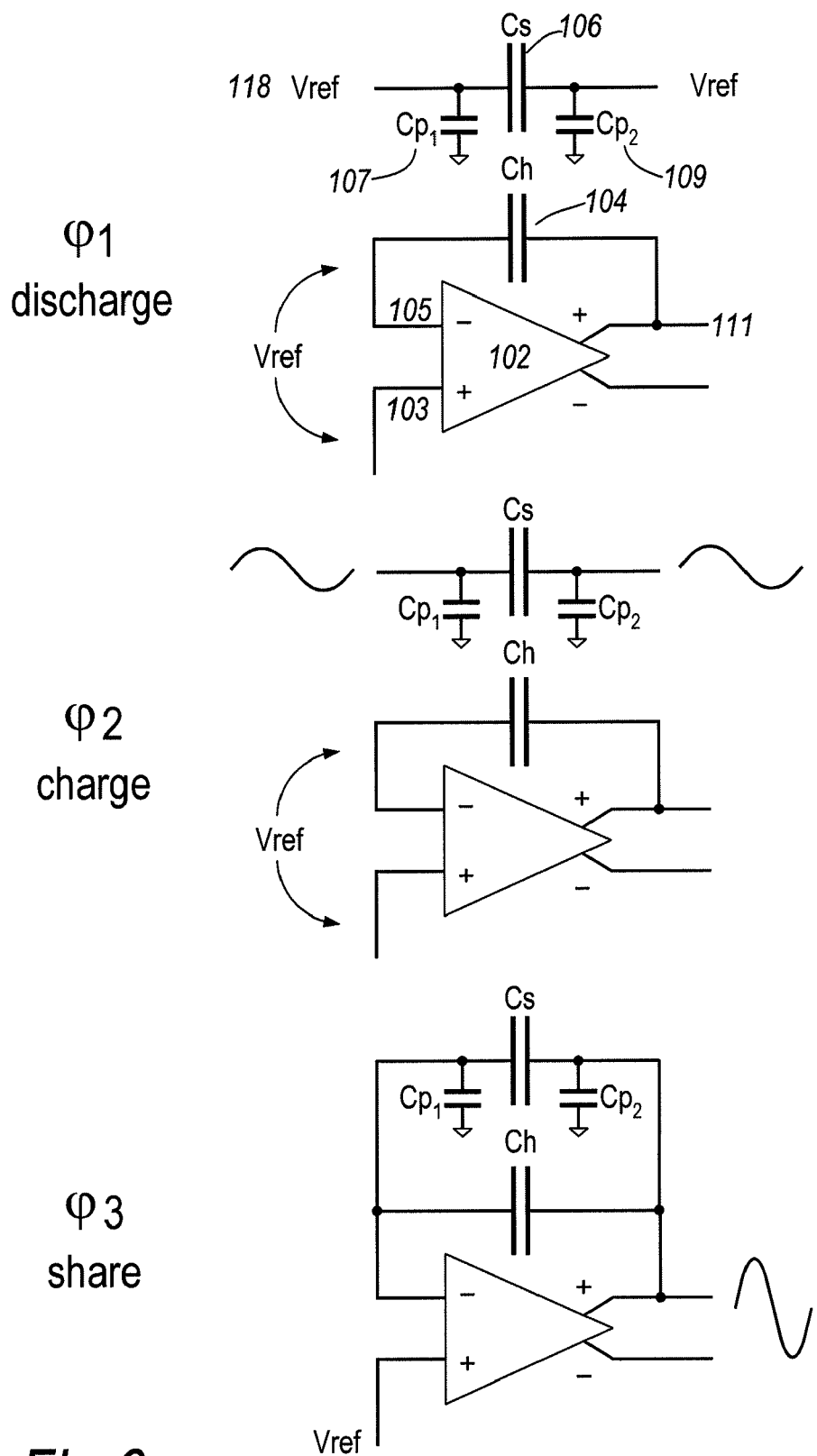
FIG. 6 illustrates the previously-proposed operation of the FIG. 5 D/A converter in each of its clock phases.
Figure 8:
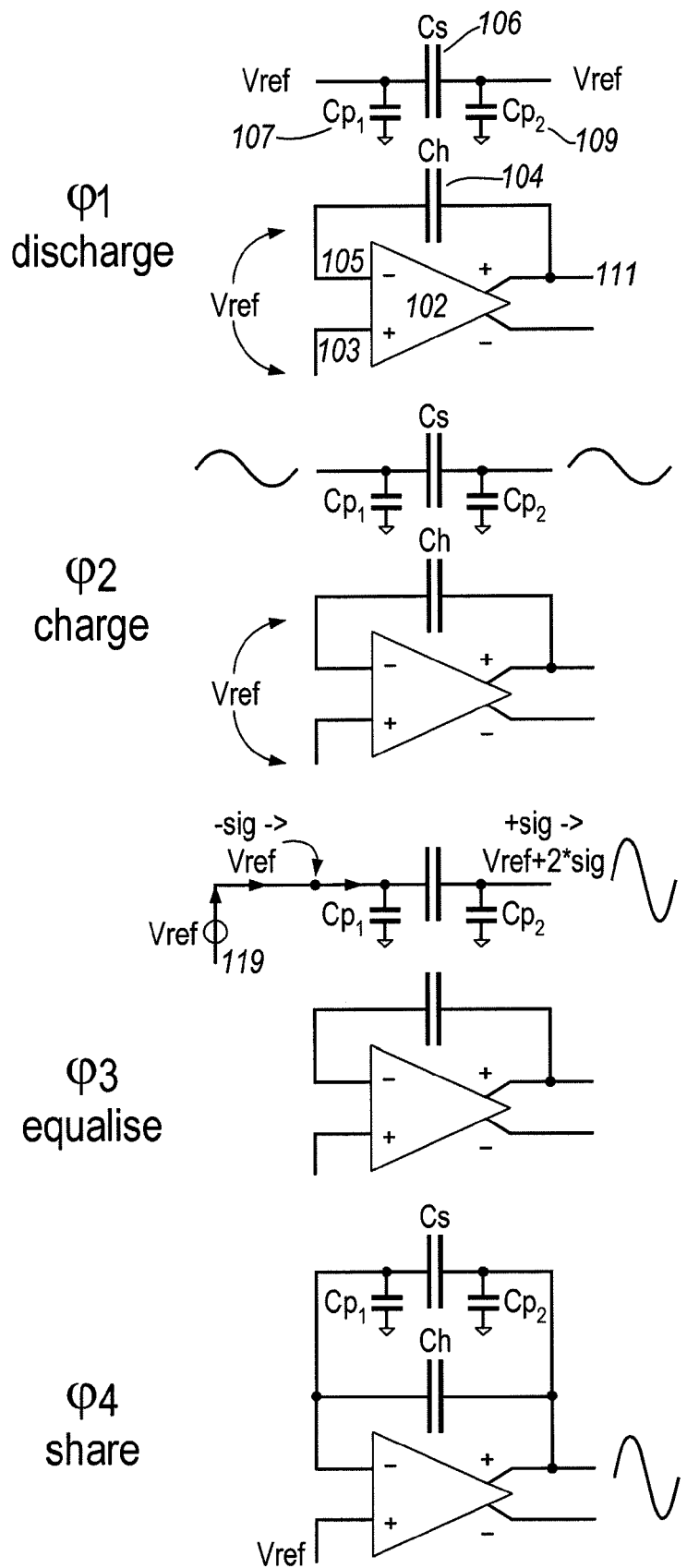
FIG. 8 illustrates the operation of the D/A converter of this embodiment in each of its four clock phases.

As explained above with reference to FIG. 6, there is a problem in the previously-proposed bipolar-charging, switched-capacitor digital-to-analogue converter in that a large transient input voltage is applied to the operational amplifier during the share phase. To avoid this problem, an embodiment of the present invention provides a special clock phase (normally provided in addition to the three phases described earlier), during which the voltage on the input side of the sampling capacitors is equalised to the reference voltage Vref, as shown in FIG. 8. This special clock phase is called an equalisation clock phase below. To provide this equalisation function, an additional switch may be provided between the input side of each sampling capacitor and the reference voltage, which is turned on during the equalisation phase. Alternatively, in the special case of Vref=Vp, the switch that connects the input side of the sampling capacitors to the reference voltage Vref can be re-used during the equalisation phase. In other respects, however, the circuit structure can be the same as that of FIG. 5 explained above.

Figure 7:
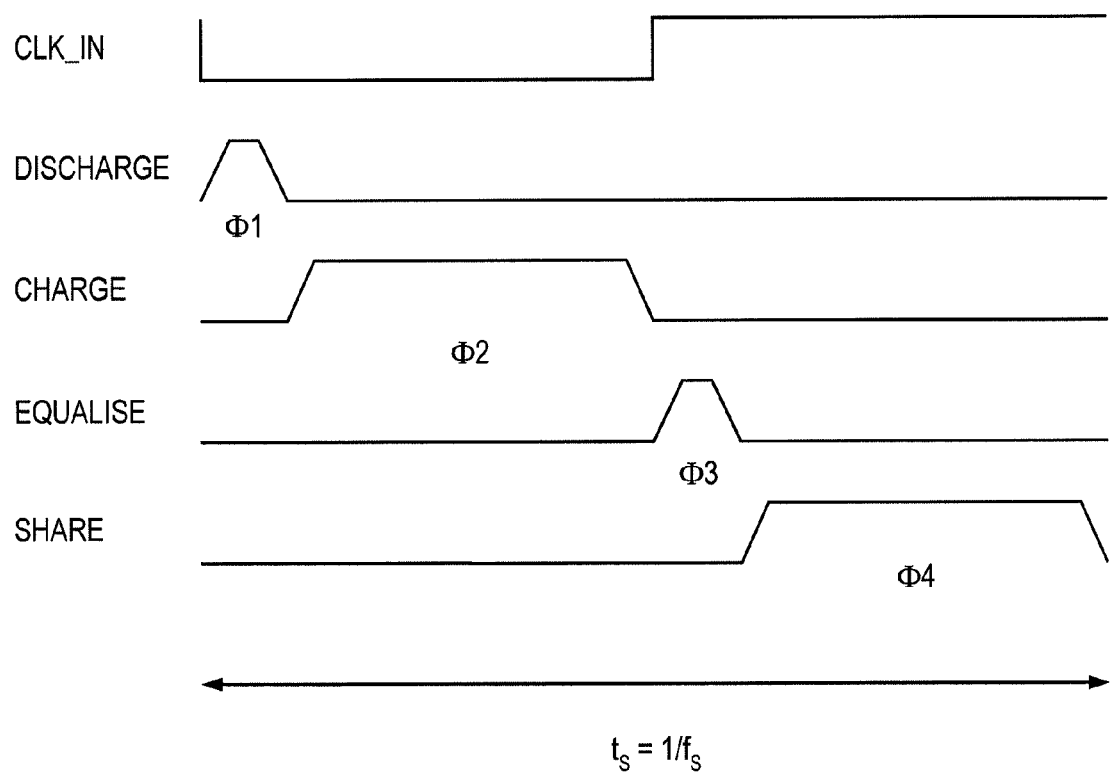
FIG. 7 illustrates a four-phase clocking scheme adopted in a switched-capacitor, bipolar charging D/A converter embodying the present invention.

In the preferred embodiment, the equalisation clock phase is added as an extra clock phase (new phase $\phi_3$) inserted between the charge phase ($\phi_2$) and the share phase (now renumbered as $\phi_4$), as shown in the timing diagram of FIG. 7.

During the extra equalisation clock phase $\phi_3$ the input side of each sampling capacitor 106 is connected to a low impedance reference voltage Vref source 119 whilst the output side (right-hand side) is left floating. This has the effect of raising the voltage on both sides of the capacitor plates such that the voltage on the output side of the capacitor plates now equals:

$$V_{C_{s,r}} = V_{ref} + 2V_{sig} \qquad \text{Equation 4}$$

and the voltage on the input side of the sampling capacitors 106 equals the reference voltage. In other words, the effect of the added equalisation clock phase is to shift all of the signal and therefore all of the signal dependency to the output side of the capacitor 106. The current required to charge the parasitic capacitances is now provided by the reference voltage source 119, as indicated by the arrows in phase $\phi_3$ of FIG. 8.

In this clocking scheme, the parasitic capacitance 109 at the output side 111 of the operational amplifier 102 receives a part of the change in voltage:

$$V_{C_{p2}} = \frac{C_s}{C_{p2} + C_s} V_{sig} \qquad \text{Equation 5}$$

as a result of the capacitive divider formed by Cs 106 and $C_{p2}$ 109. The charge transferred to $C_{p2}$ is lost from Cs and results in a negative gain error.

However, the inputs of the operational amplifier 102 have been equalised prior to connection in the share phase $\phi_4$ and thus the charge transfer mechanism is reduced back to a passive settling as was the case in the conventional (non-bipolar charging) converter, whilst retaining the effect of the doubling of the sampled voltage and thus the doubling of the dynamic range.

As indicated in FIG. 7, the equalisation phase can be kept relatively brief so as to avoid degrading settling accuracy in the charge and share clock phases or causing timing problems for the remaining operation phases. For example, the equalisation and (if used) discharge phases may each occupy around 10% of the clock period, with the charge and share phases each taking 40%.

As a result the DAC employing this scheme can now be implemented using an operational amplifier 102 with limited slew rate, bandwidth and settling behaviour. Thus an amplifier can be constructed for the task with a significantly lower power dissipation compared with the known bipolar charging arrangement of FIG. 5.

Associated with the sampling capacitors and their respective switches are parasitic capacitances, as referred to earlier. To minimise gain error, thus preserving proportionality between the amplifier output and input voltages, it is preferable to "scale" these parasitic capacitances. This can be achieved by designing the layout of the circuit on the substrate such that the sizes of the parasitic capacitances match the sizes of the sampling capacitors, which in the described embodiment are of three different sizes, such as a multiple 1, 2 or 4 of a basic capacitance unit. Such scaling may involve suitably dimensioning tracks on the substrate, and/or constituting each sampling capacitor and switch from multiple unit capacitors and switches, as is known in the art.

Figure 4:
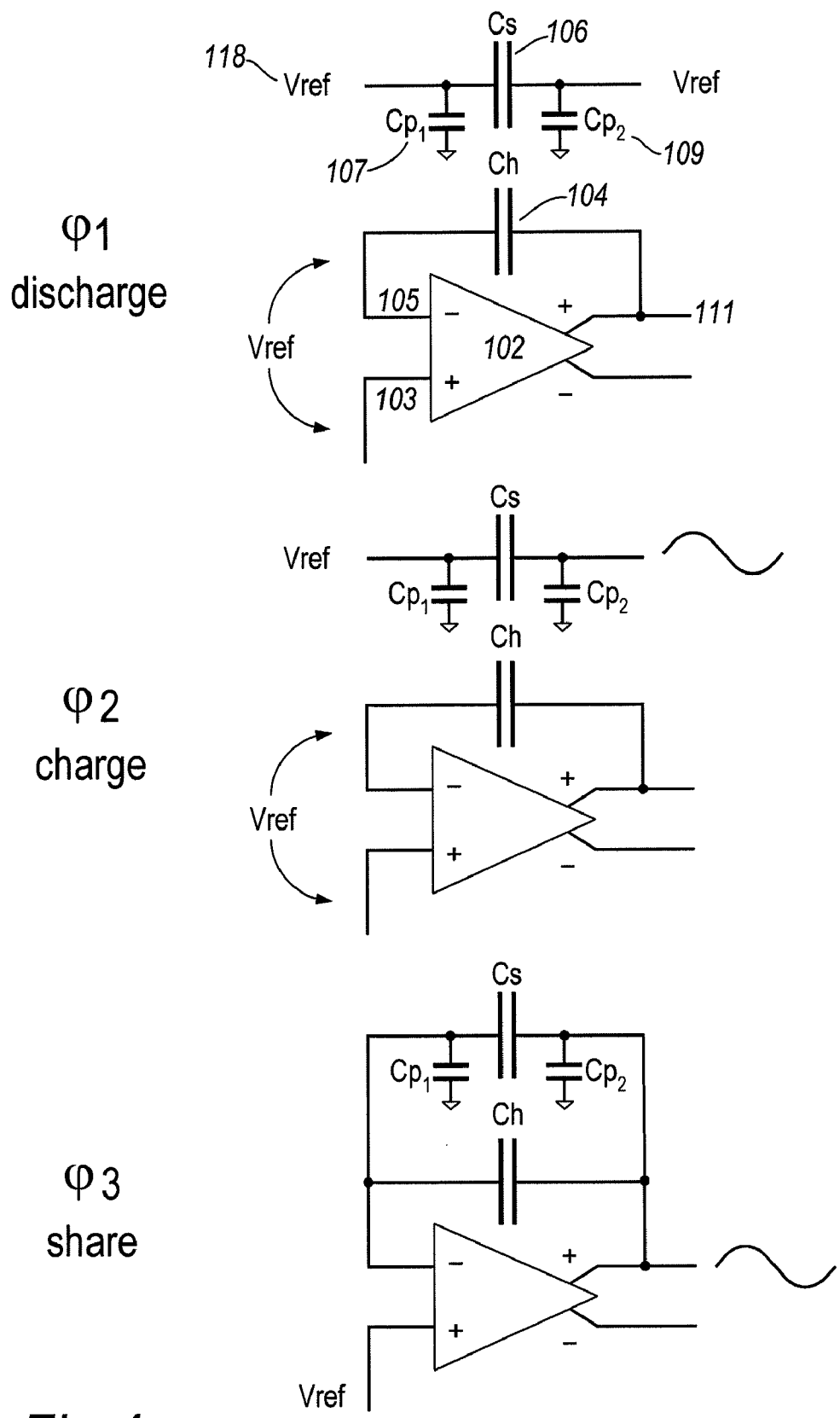
FIG. 4 illustrates the operation of the FIG. 2 D/A converter in each of the three phases of FIG. 3.

To confirm the effect of the equalisation clock phase, as an example a D/A converter was designed using an amplifier 102 optimised for power consumption. Tests were carried out both using a three-phase clock mode consisting of discharge-charge-share as shown in FIG. 4, as well as using the four-phase clock consisting of discharge-charge-equalise-share in accordance with the present invention and as shown in FIG. 8. Apart from this the circuits were completely equal, in other words the structure of the FIG. 5 bipolar charging DAC is equally applicable to the present invention.

Figure 9:
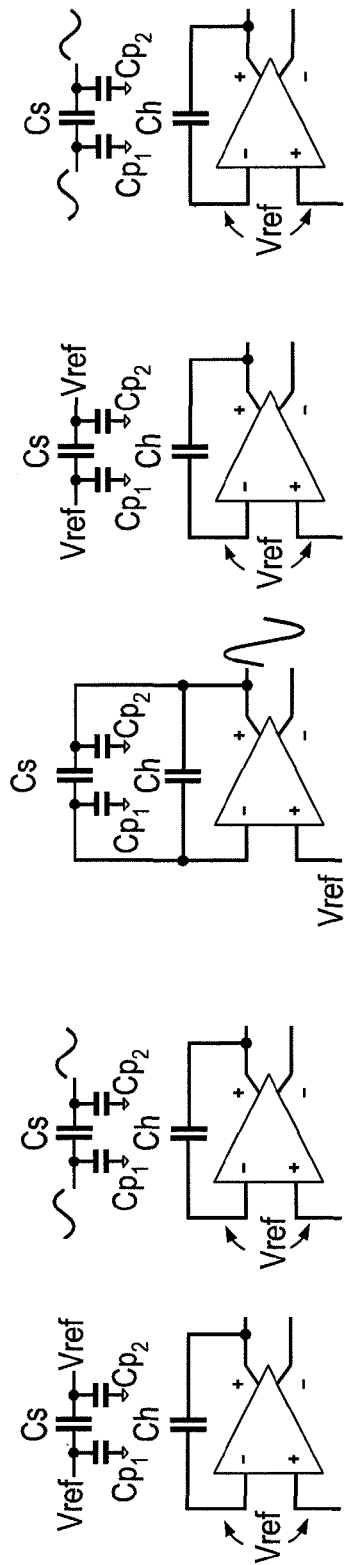
FIG. 9 is a graph of voltages on the plates of one of the sampling capacitors of a switched capacitor D/A converter in the three-phase clocking scheme.
Figure 9:
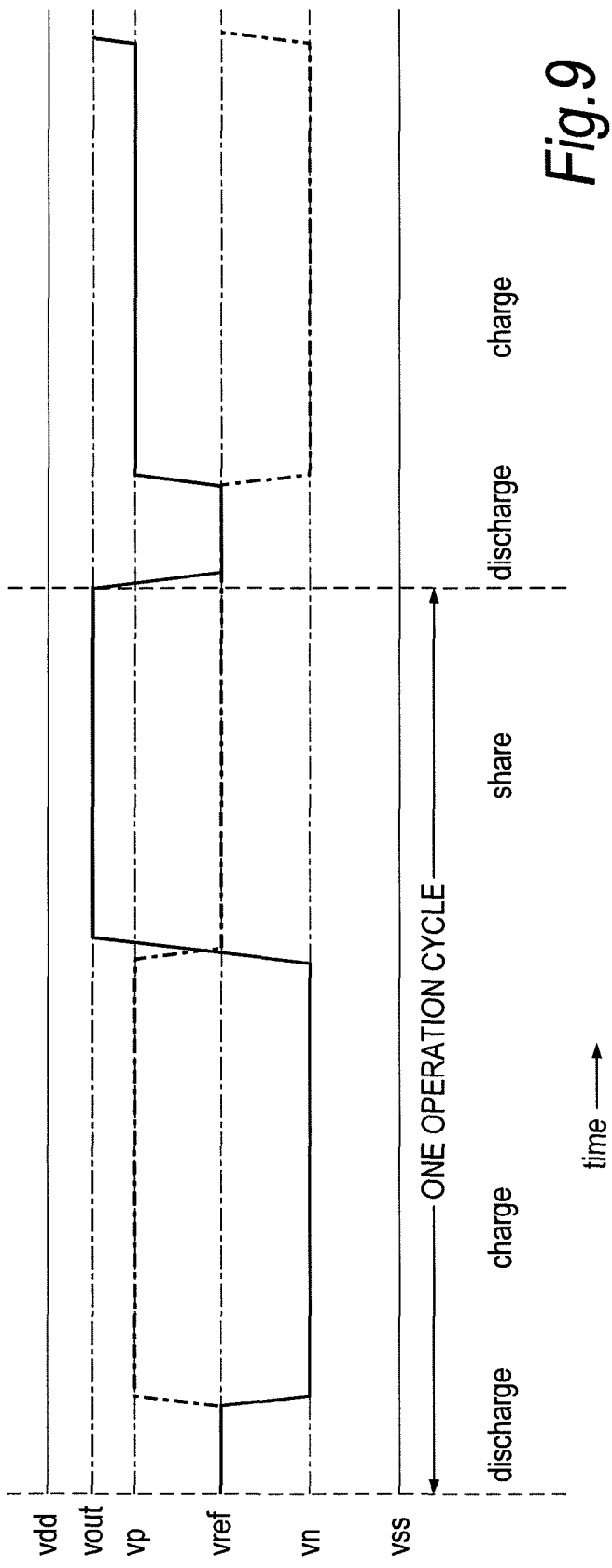

FIG. 9 depicts the operation of the DAC in the time domain in three-phase mode, showing the voltages on one of the sampling capacitors 106. The voltages on the other sampling capacitors behave in a similar fashion. The x-axis represents time and the y-axis represents voltage, with power supply voltages Vss and Vdd spanning, for example, 1.8v, and with, as before, Vout, Vp/Vn and Vref being respectively the output of the opamp, the predetermined data-dependent voltages and the reference voltage. A data sequence of D=1 followed by D=0 applied to the sampling capacitor is shown.

The voltage on the input-side or left-hand plate of the capacitor is represented by a dot-dash line, and that on the output-side or right-hand plate by a short dashes, long dash line in the Figure It can be seen that in the discharge phase, both capacitor plates are driven to Vref which is the midrail or half-supply reference voltage of, for example, 0.9v. Subsequently, i.e. in the charge phase, for a data bit D=1 applied to this sampling capacitor, the left-hand (input-side) plate is charged to Vp and the right-hand plate is charged to Vn. After the charge phase, the share phase is initiated and the operational amplifier 102 drives its output until the left-hand plate reaches the 0.9V Vref voltage. For the case where D=0 (see the following operation cycle in FIG. 9), the left-hand plate is charged to Vn in the charge phase, and brought up to Vref in the share phase.

Figure 10:
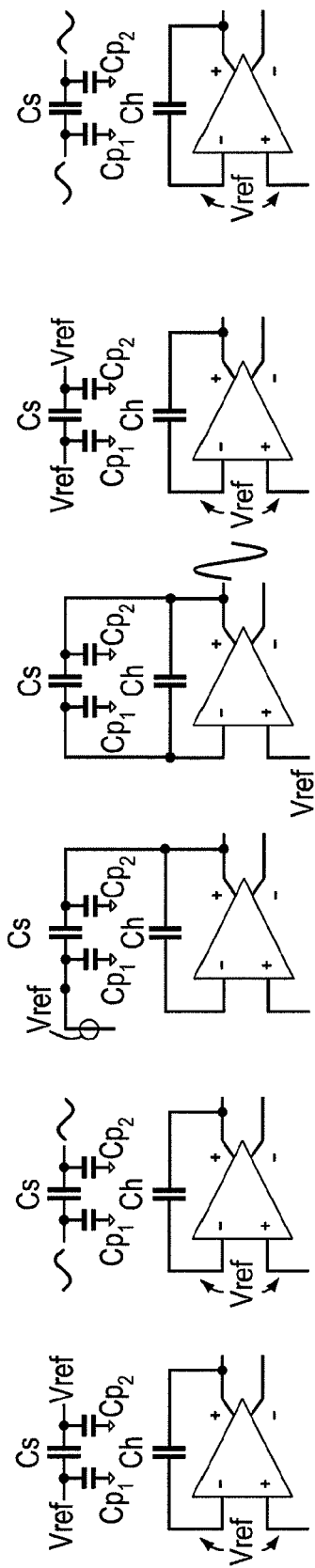
FIG. 10 is a graph corresponding to FIG. 9 for the four-phase clocking scheme adopted in the embodiment of the present invention.
Figure 10:
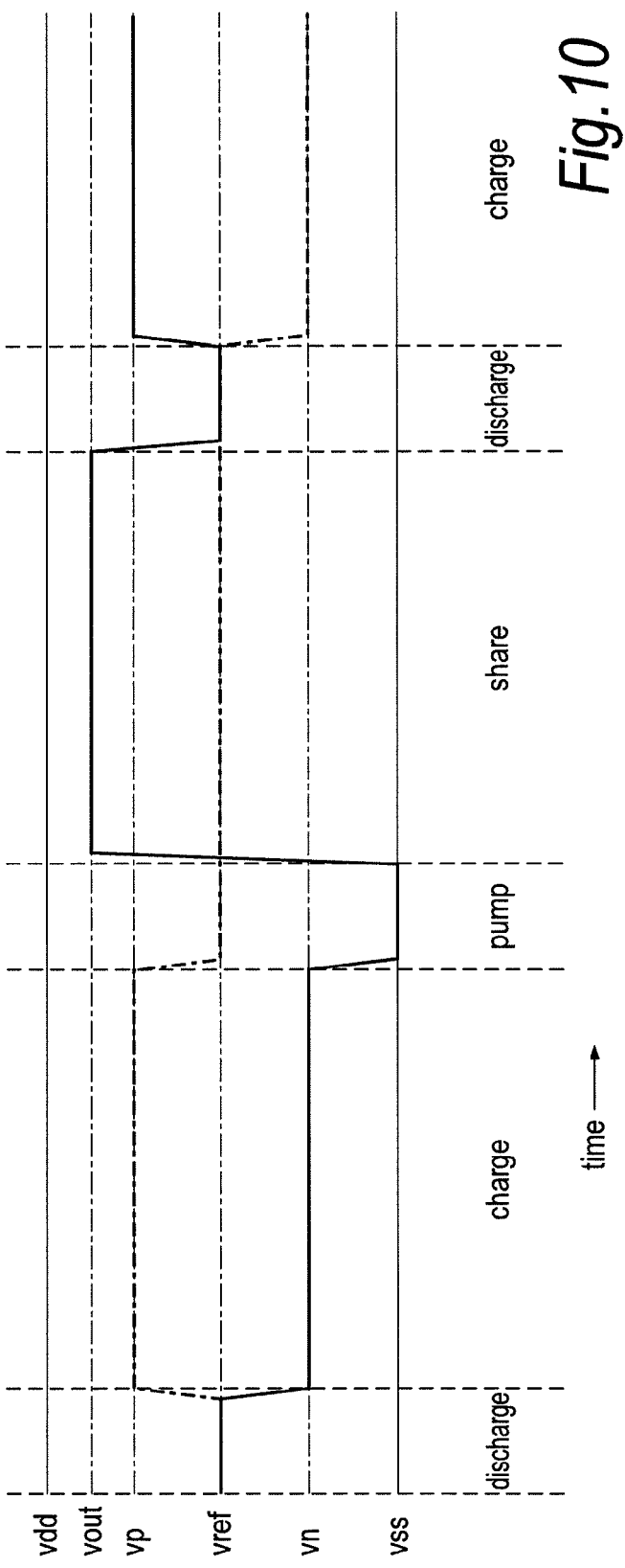

FIG. 10 depicts the same operation in four-phase clocking mode, i.e. in the embodiment of the present invention. During the charge phase, in the same fashion as before for D=1, the left-hand (input-side) plate is charged to Vp and for D=0 it is charged to Vn.

However it can be seen that as soon as the extra 'equalise' clock phase (denoted "pump" in FIG. 10, and by $\phi_3$ in FIGS. 7 and 8) is initiated, the voltage on the left-hand plate is driven to the 0.9V Vref. Since the right-hand capacitor plate is floating it is driven down (D=1) or rises up (D=0) along with the left-hand plate. Subsequently, the share phase ("share" in FIG. 10, $\phi_4$ in FIGS. 7 and 8) is initiated. The left-hand plate of the capacitor 106 has been pre-charged to Vref and no transient effects occur when transitioning to the share phase. The output side of the capacitor 106 assumes the output voltage Vout and stays there until the next discharge clock phase.

Figure 1:
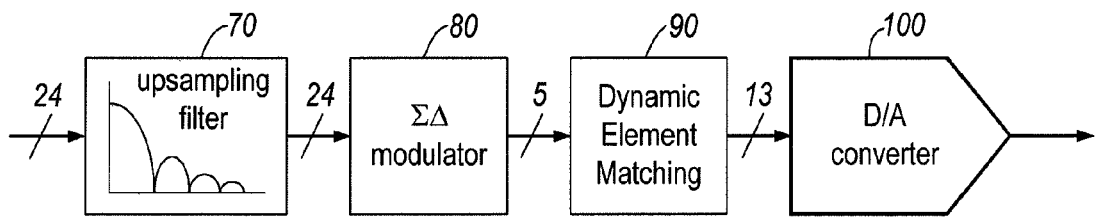
FIG. 1 illustrates a conventional audio D/A converter signal chain.
Figure 3:
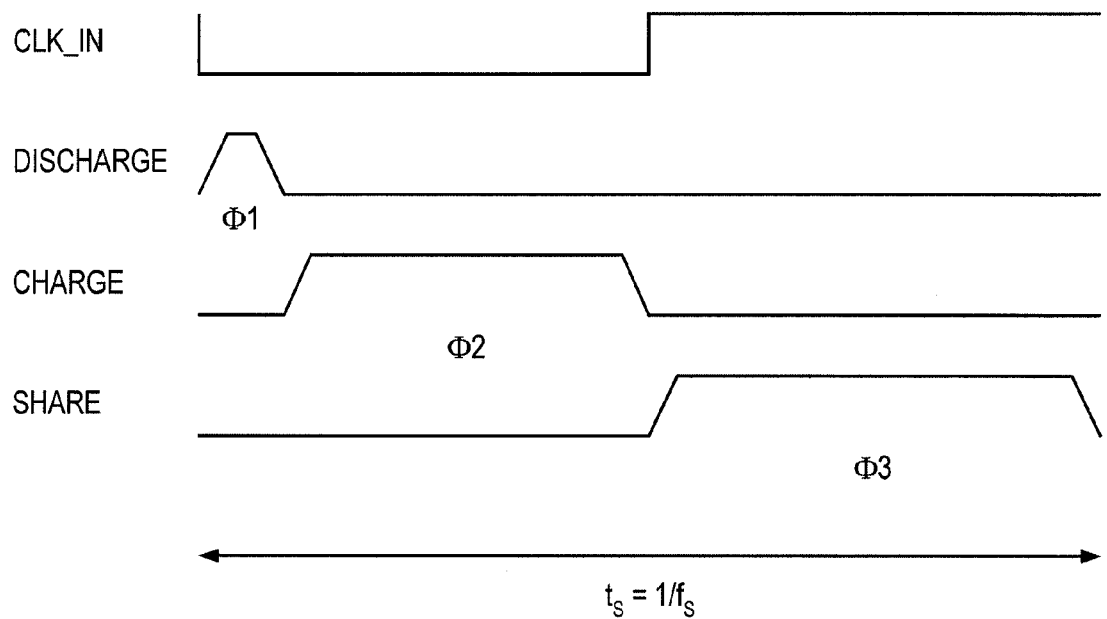
FIG. 3 illustrates a three-phase clocking scheme of a D/A converter of the FIG. 2 type.
Figure 11A:
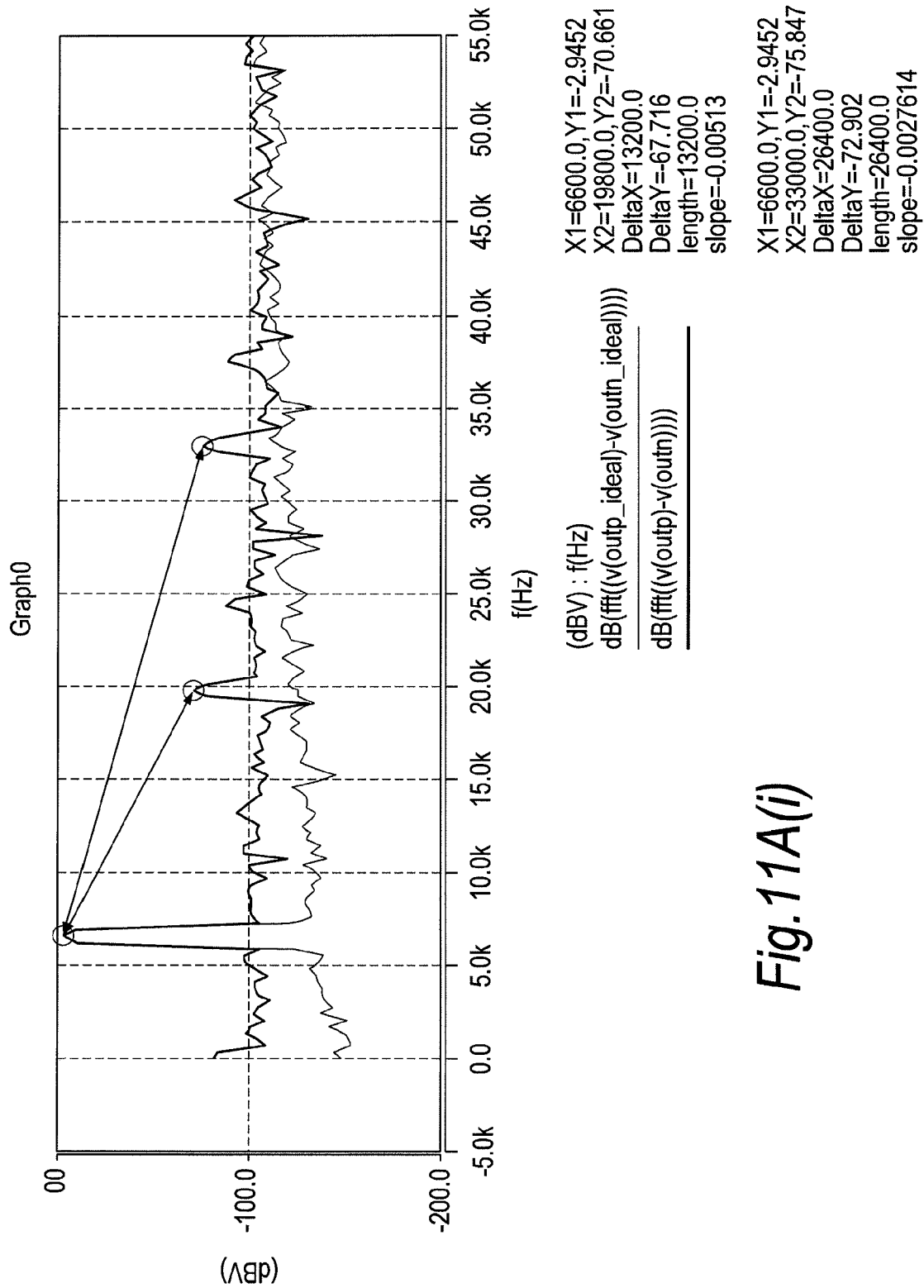
FIGS. 11A and 11B show simulation results for a D/A converter employing bipolar charging and three-phase clocking, FIG. 11A being a screen dump from a simulation tool and FIG. 11B a graph of distortion peaks in the output of this D/A converter.
Figure 11B:
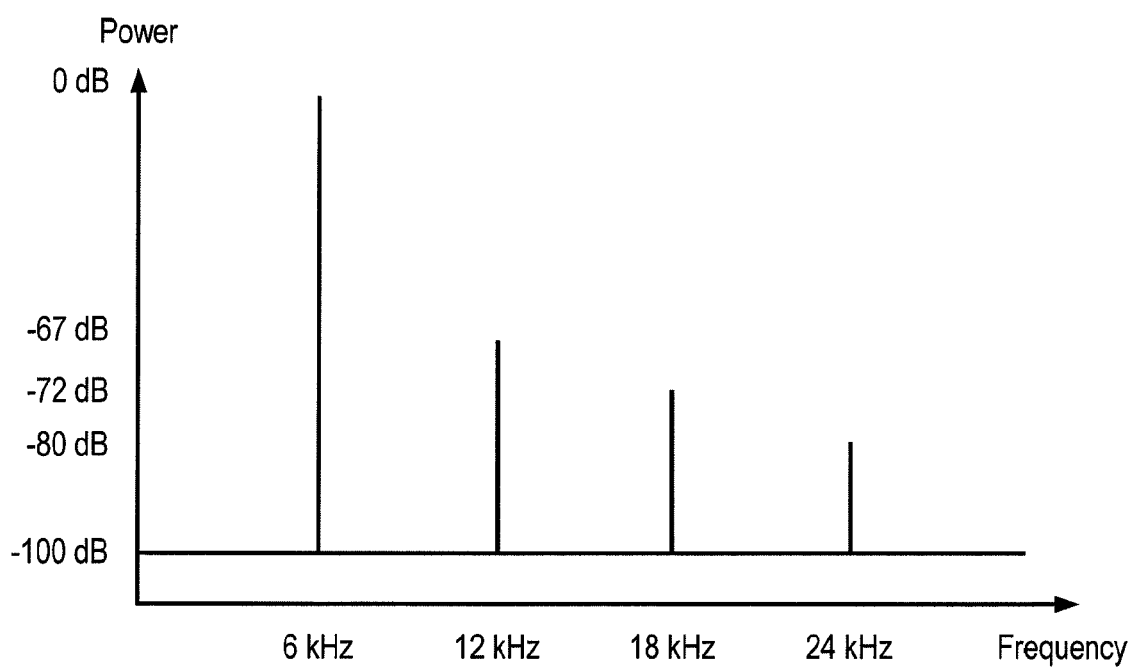
Figure 12A:
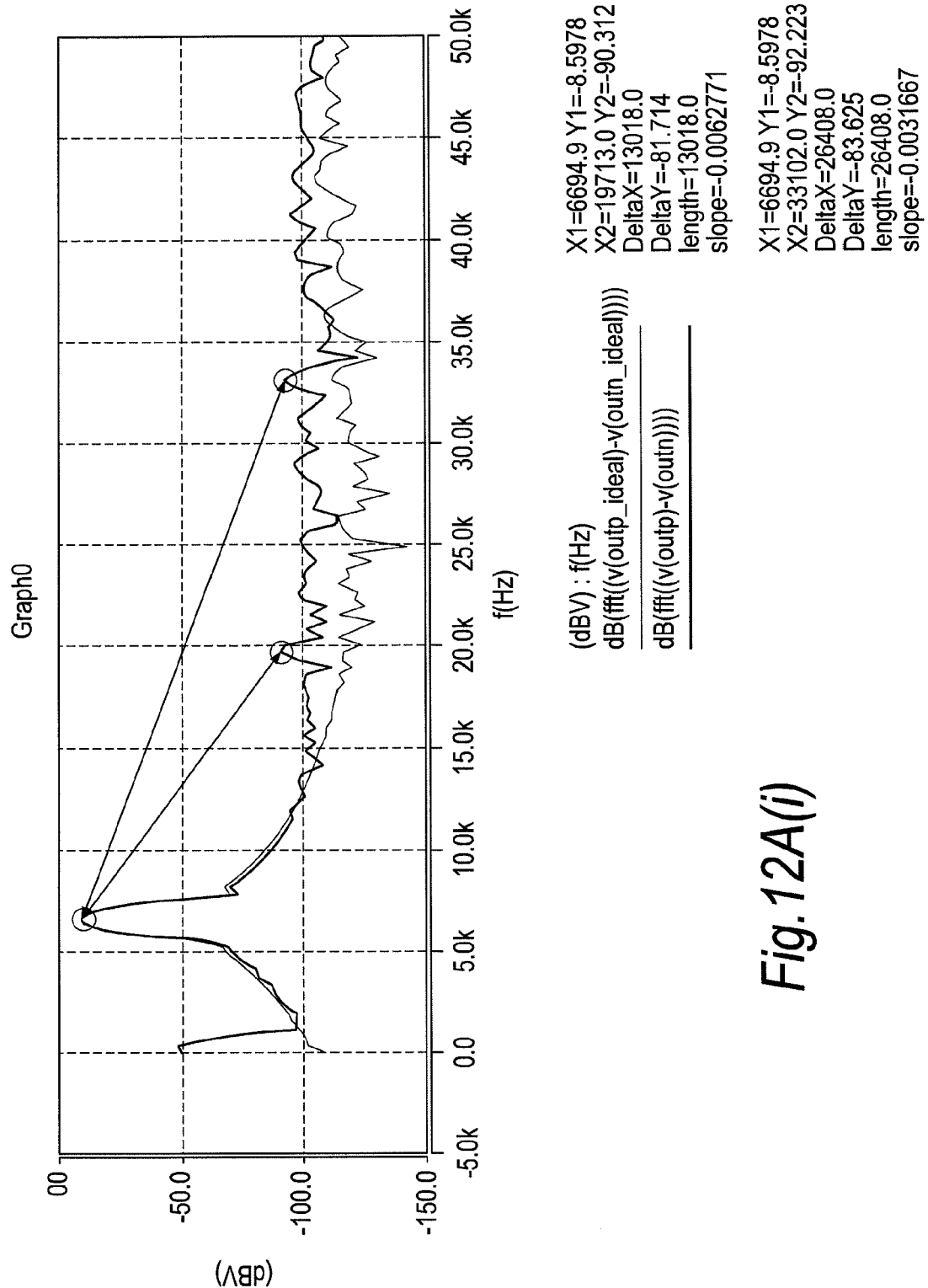
FIGS. 12A and 12B show simulation results for the D/A converter embodying the present invention, employing bipolar charging and four-phase clocking, FIG. 12A being a screen dump corresponding to FIG. 11A, and FIG. 12B a graph corresponding to FIG. 11B.
Figure 12B:
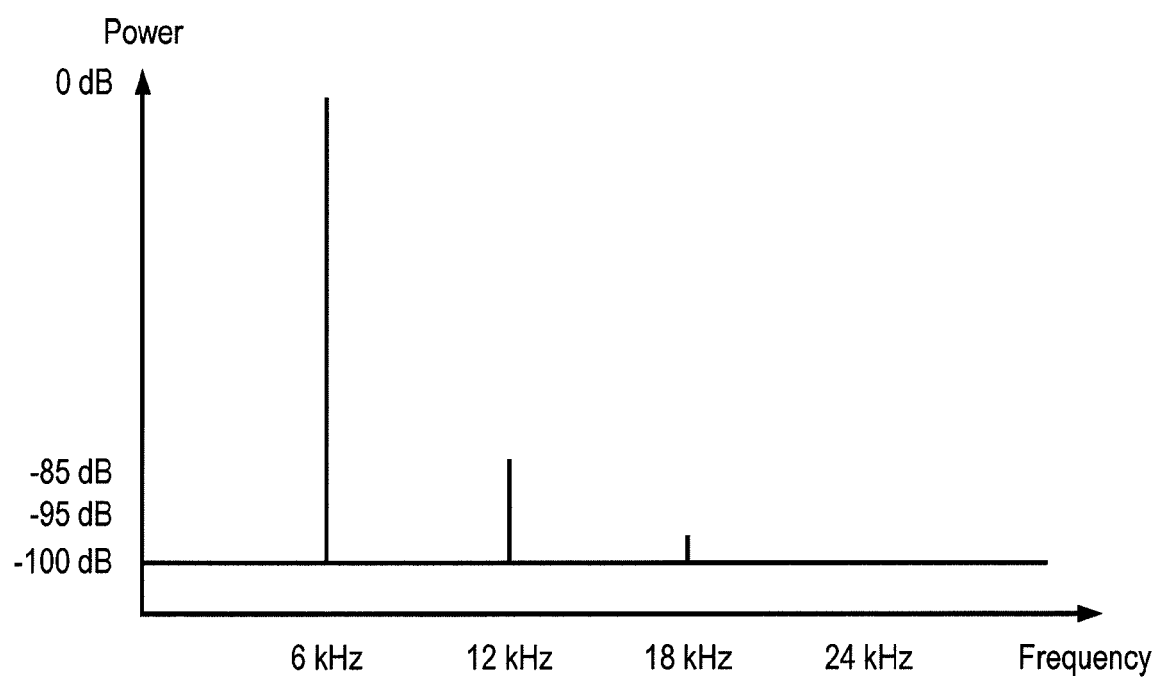

The D/A converter described in the previous paragraphs was simulated with digital data representing a pure digital sine wave and the output was measured using a Fast Fourier Transform (FFT). The simulation results for the three-phase clocking implementation are shown in FIG. 11A, and those for the four-phase clocking implementation of the present embodiment are shown in FIG. 12A. To clarify the difference, FIGS. 11B and 12B are respective power versus frequency graphs of distortion peaks in the FFT output. One measure of quality of a DAC is its total harmonic distortion (THD); according to the test results, the three-phase clocking scheme as used in the simulation of FIGS. 11A and 1B yielded four peaks for a THD of −63 dB, whereas the four-phase clocking scheme as used in the simulation of FIG. 12 produced only three peaks of much lower intensity, to yield a THD of −78 dB, the improvement being due to the quicker settling of opamp 102 obtained with the equalisation phase of the present embodiment.

It can be seen from the results above that the four-phase clocking method achieves better THD performance in the same circuit than the three-phase clocking method.

Thus, the present invention addresses a problem with a recently-proposed form of switched-capacitor DAC. The switched-capacitor DAC has a sampling phase in which charge is stored on a plurality of sampling capacitors in dependence upon input digital data; then, during a sharing phase these charges are shared with a holding capacitor which is connected across an opamp. In the so-called bipolar charging type switched-capacitor DAC, the signal provided by the sampling capacitors is doubled by connecting their opposite sides to positive and negative reference voltages during the sampling phase; however, parasitic capacitances associated with the sampling capacitors then cause a disturbance to the opamp during the sharing phase. By equalising the input sides of the sampling capacitors to a reference voltage, prior to the sharing phase, this disturbance is avoided thereby allowing a low-power opamp to be employed in the DAC, whilst retaining the SNR advantage of the bipolar charging scheme.

The above described embodiment illustrates rather than limits the invention, and those skilled in the art will be able to design many alternative embodiments without departing from the scope of the appended claims and their equivalents.

Figure 2A:
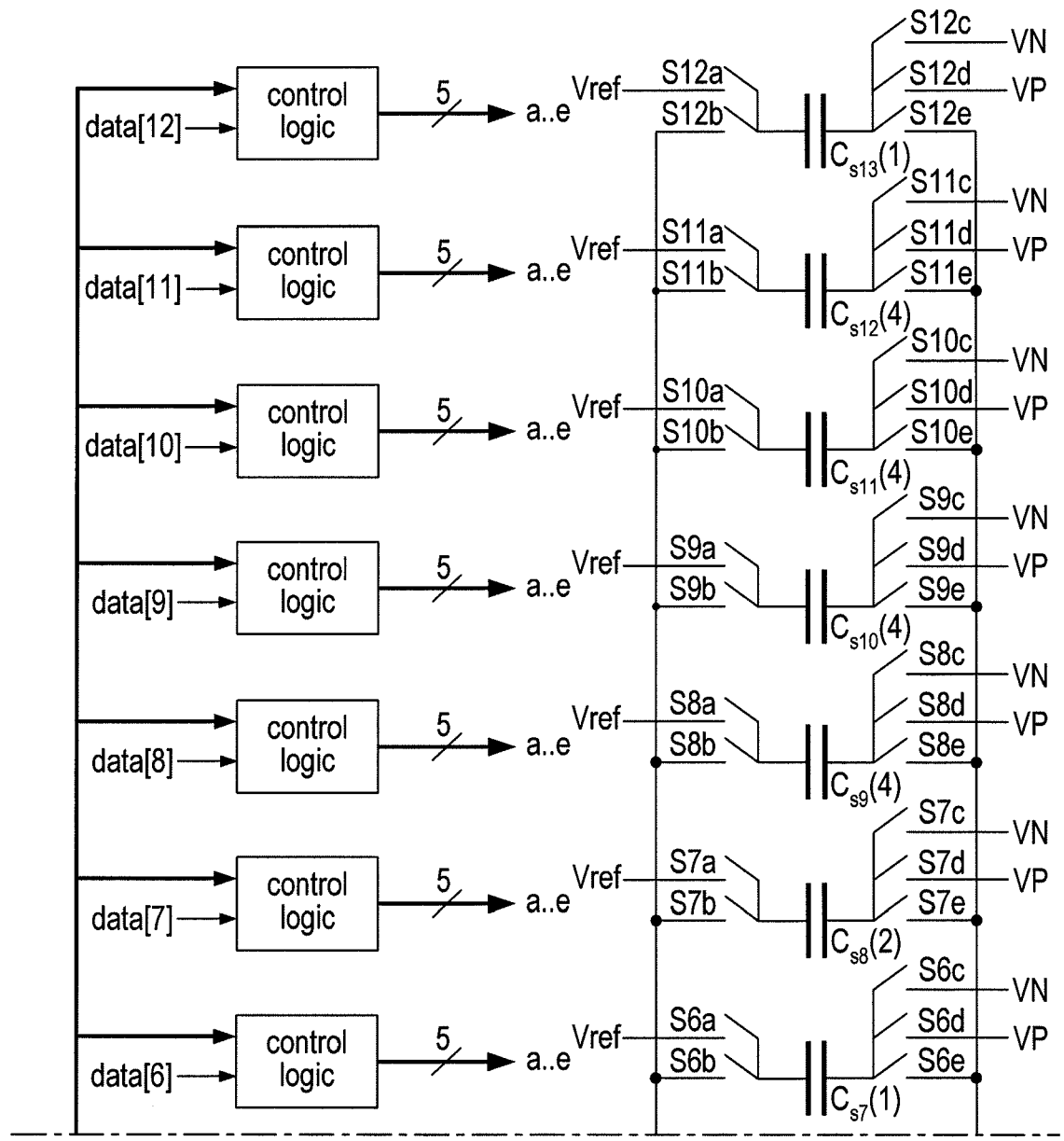
FIGS. 2A and 2B are schematic circuit diagrams of a known switched-capacitor D/A converter, FIG. 2A showing the overall circuit structure and FIG. 2B focussing on a single capacitor stage.
Figure 2B:
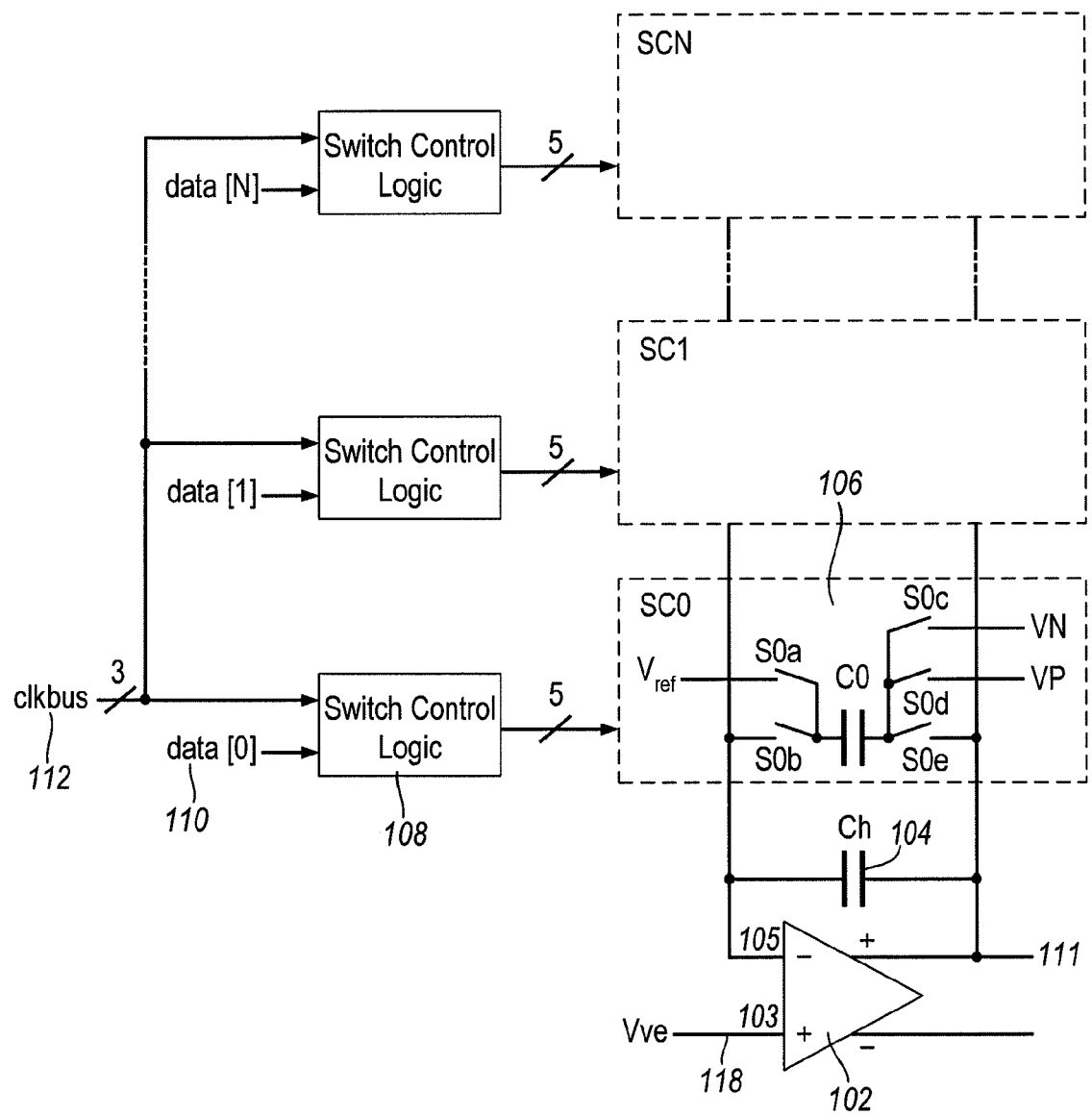

Although the preferred configuration involves a combination of binary-weighted and equal-sized sampling capacitors, a DAC embodying the present invention can be constructed using purely binary-weighted capacitors, or with equal-sized capacitors controlled using a "pure" thermometer code. More generally, there is no need for a plurality of sampling capacitors; a single sampling capacitor is also possible. Also, whilst the above description has referred to a DAC of a single-input, single-amplifier configuration, this is not essential. A differential configuration, in which complementary inputs are applied to one input of each of two operational amplifiers, or to both inputs of a single differential amplifier, is also possible. In this case, the ladder of capacitor stages SC0, SC1, ... SCN shown in FIG. 2B for example is augmented with a similar but mirror set of capacitor stages for the other input, receiving signals of opposite polarities to those used in the stages already shown.

Whilst the above description has focused on a DAC by way of example, the present invention is not restricted to DACs. More generally, the present invention can be applied to any switched-capacitor circuit whether or not it acts as a DAC.

In its above-described form, the switched-capacitor circuit processes digital data and therefore acts as a DAC. However, as will be understood by a person skilled in the art, a DAC is a special case of a switched-capacitor integrator. If, in place of one of either of two fixed reference voltages, dependent on data, one were to supply an analogue voltage onto the sampling capacitors, the circuit would become a sample-and-hold filter (since the time-discrete charge phase samples the input analogue voltage). It would even be possible to combine an analogue input with digital data, with some sampling capacitors being charged to a fixed reference based on digital data, and others sampling an analogue voltage. In such a case, the circuit would act as a DAC combined with a sample-and-hold filter, effective for mixing together two or more analogue signals, or analogue and digital signals. In any such arrangement of a bipolar-switching type switched capacitor circuit, it is desirable to employ the same feature as described above, of providing an additional equalisation phase of operation prior to the sharing phase of the sampling capacitors.

Whilst a four-phase operation of the circuit is preferred as set out above, to reduce signal dependence of current drawn from the reference voltage sources, there may be applications in which the discharge or reset phase is not necessary—for example where the input signal is smoothly varying without sudden changes in level. In this instance it may still be advantageous to provide the equalisation phase so that the voltage on the input sides of the sampling capacitors can be raised up to Vref.

Although the invention has been described in relation to a single audio signal or channel, it can of course be applied to multiple channels, such as left and right channels of a stereo system or any of the channels of surround sound systems. Furthermore, where the invention is applied to a plurality of audio signals or channels, some elements may provide common functions to those plurality of signals/channels. With separate DACs, the clocking scheme described above may be employed in common for all channels, sending the same clocks to a DAC of each channel. Also, common power supply rails and a common reference voltage source may be used for all channels, as well as for other functional blocks of a chip or audio system employing the DAC. It will be apparent that by reducing the need for the opamp to supply current from its output to input, the present invention can reduce voltage ripples on power supply lines which could otherwise have unwanted effects on other parts of an audio system. Although primarily envisaged for audio applications as mentioned in the introduction, the switched-capacitor digital-to-analogue converter of the above embodiment may be applied to non-audio signals, such as video or graphics signals, and in signal processing generally. For the avoidance of doubt, it should be noted that the word "comprising" does not exclude the presence of elements or steps other than those listed in a claim, "a" or "an" does not exclude a plurality, and a single element may fulfil the functions of several elements recited in the claims. Any reference to "addition", "add" or "adding" may equally mean subtraction.

Audio applications of the present invention include portable devices (MP3 players; mobile phones; PDAs and satellite navigation devices); Hi-Fi equipment including disk-based players such as DVD/CD; televisions; and digital cameras (Still & Video). The present invention has particular application to portable equipment because it enables the switched-capacitor digital-to-analogue converter to employ an inexpensive and low-power operational amplifier. In addition, the present invention may find application in fixed or semi-fixed installations such as in-car entertainment, aircraft on-board entertainment systems and so forth.

Embodiments of the present invention may be implemented in hardware, or as software modules running on one or more processors, or on a combination thereof. That is, those skilled in the art will appreciate that a programmable analog array, field programmable gate array (FPGA), application specific integrated circuit (ASIC), microprocessor or digital signal processor (DSP) may be used in practice to implement at least some of the functionality of the switched-capacitor digital-to-analogue converter described above.

Such devices may require program code for their operation or initial setting. Thus, the invention may also be embodied as one or more device or apparatus programs, which depending upon the hardware to be used may be written in microcode, assembler code, code in a hardware description language such as Verilog™, or program code In a high-level language). Such programs embodying the present invention may be stored on computer-readable media, or could, for example, be in the form of one or more signals. Such signals may be data signals downloadable from an Internet website, or provided on a carrier signal, or in any other form.

The invention claimed is:

1. A switched-capacitor circuit comprising:
an operational amplifier having a first input, a second input, and an output;
a holding capacitor having a first side and a second side respectively coupled between the first input and the output of the operational amplifier;
one or more sampling capacitors each having a first side and a second side and each provided with respective switches to selectively couple the one or more sampling capacitors to any of first and second voltage sources, a reference voltage, and the holding capacitor; and
switching logic configured to control said switches in a repetitive operation cycle, said operation cycle including:
a charging phase in which the switching logic selects at least one of the sampling capacitors to be connected at either side thereof to the first and second voltage sources respectively;
an equalization phase in which the switching logic connects the first side of the one or more sampling capacitors to the reference voltage to change the voltage on both sides of the sampling capacitors if the first side has a voltage other than the reference voltage; and
a sharing phase in which the switching logic connects the one or more sampling capacitors across the holding capacitor for transferring charge from the sampling capacitors to the holding capacitor.

2. The switched-capacitor circuit according to claim 1 wherein the operation cycle further comprises a reset phase prior to said charging phase, in which the switching logic connects both sides of each sampling capacitor to the reference voltage.

3. The switched-capacitor circuit according to claim 1 wherein the switching logic is configured to control switches for each sampling capacitor in common apart from during the charging phase, and responsive to input data during the charging phase to connect the switches to the first and second voltage sources so as to apply an inverted data dependent reference voltage to the first side of each selected sampling capacitor and a non-inverted data dependent reference voltage to the second side of each selected sampling capacitor.

4. The switched-capacitor circuit according to claim 1 wherein the switching logic is responsive to respective clock signals for each said phase of the operation cycle, an active period of the clock signal for the equalisation phase being relatively short in comparison with active periods of the clock signals for the charging phase and the sharing phase.

5. The switched-capacitor circuit according to claim 1 wherein the first input of the operational amplifier is an inverting input, and the second input is a non-inverting input connected to the reference voltage.

6. The switched-capacitor circuit according to claim 5 having a differential arrangement wherein a second holding capacitor is coupled between the second input and an output of the operational amplifier, together with one or more second sampling capacitors and associated switches and switching logic to mirror said holding capacitor, one or more sampling capacitors, switches and switching logic associated with the first input.

7. The switched-capacitor circuit according to claim 1 when implemented on a substrate, further comprising a low-impedance reference voltage source, the switching logic being configured, during the equalization phase, to connect the first side of each sampling capacitor to the low-impedance reference voltage source whilst leaving the second side floating, wherein the reference voltage source is effective, during the equalisation phase, to charge a parasitic capacitance between the substrate and each of the sampling capacitors.

8. The switched-capacitor circuit according to claim 7 wherein said first and second voltage sources provide a positive reference voltage and a negative reference voltage, respectively, and wherein each sampling capacitor is provided with:
- a first switch to connect the first side to the positive reference voltage;
- a second switch to connect the first side to the negative reference voltage;
- a third switch to connect the first side to the first side of the holding capacitor;
- a fourth switch to connect the second side to the negative reference voltage;
- a fifth switch to connect the second side to the positive reference voltage;
- a sixth switch to connect the second side to the second side of the holding capacitor; and
- a seventh switch to connect the first side to the reference voltage source;
wherein the circuit is arranged to receive input data in the form of a bit of digital data for each said sampling capacitor, such that in said charging phase, the switching logic is responsive to a "0" bit of said digital data to switch on the first and the fourth switches, and responsive to a "1" bit of said digital data to switch on the second and fifth switches, thereby applying across the sampling capacitor the potential difference between the positive reference voltage and negative reference voltage; and
wherein, in said equalisation phase, the seventh switch connects the first side of the sampling capacitor to the reference voltage source.

9. The switched-capacitor circuit according to claim 1, wherein a plurality of the sampling capacitors are provided including capacitors of at least two different capacitance values.

10. The switched-capacitor circuit of claim 9 wherein the first and second voltage sources provide fixed voltages and the switching logic is responsive to digital input data consisting of a plurality of parallel bits corresponding in number to the sampling capacitors, whereby the circuit acts as a digital-to-analogue converter.

11. The switched-capacitor circuit according to claim 1 wherein the first and second voltage sources provide an analogue voltage, whereby the circuit acts as a sample-and-hold filter.

12. The switched-capacitor circuit according to claim 11 wherein there are a plurality of the sampling capacitors each having respective said first and second voltage sources providing an analogue voltage, whereby the circuit further acts as a mixer.

13. A portable audio apparatus including the switched-capacitor circuit of claim 1 and wherein the operational amplifier is a low-power operational amplifier.

14. A sample-and-hold circuit comprising:
- an operational amplifier having a first input, a second input, and an output;
- a holding capacitor having a first side and a second side respectively coupled between the first input and the output of the operational amplifier;
- at least one sampling capacitor having a first side and a second side and provided with respective switches to selectively couple the sampling capacitor to any of first and second voltage sources, a reference voltage, and the holding capacitor; and
- switching logic arranged to control said switches in a repetitive operation cycle, said operation cycle including:
  - a charging phase in which the switching logic allows the sampling capacitor to be connected at either side thereof to the first and second voltage sources respectively; and
  - a sharing phase in which the switching logic connects the sampling capacitor across the holding capacitor for transferring charge from each sampling capacitor to the holding capacitor.

15. The sample-and-hold circuit according to claim 14, wherein the switching logic is further arranged to perform, between said charging phase and said sharing phase, an equalization phase in which the switching logic connects the first side of the sampling capacitor(s) to the reference voltage to change the voltage on both sides thereof if the first side has a voltage other than the reference voltage.

* * * * *